United States Patent
Veroni

(10) Patent No.: US 7,692,421 B2
(45) Date of Patent: Apr. 6, 2010

(54) CONTROL METER WITH SAFETY DEACTIVATION

(75) Inventor: Fabio Veroni, Vimercate-Milan (IT)

(73) Assignee: ENEL Distribuzione S.p.A., Rome (IT)

( * ) Notice: Subject to any disclaimer, the term of this patent is extended or adjusted under 35 U.S.C. 154(b) by 358 days.

(21) Appl. No.: 11/629,511

(22) PCT Filed: Jun. 7, 2005

(86) PCT No.: PCT/EP2005/006102

§ 371 (c)(1),
(2), (4) Date: Jan. 17, 2008

(87) PCT Pub. No.: WO2005/124373

PCT Pub. Date: Dec. 29, 2005

(65) Prior Publication Data

US 2008/0258708 A1    Oct. 23, 2008

(30) Foreign Application Priority Data

Jun. 15, 2004    (EP) .................................. 04014022

(51) Int. Cl.
*G01R 11/24* (2006.01)
(52) U.S. Cl. .................................................... 324/110
(58) Field of Classification Search ................ None
See application file for complete search history.

(56) References Cited

U.S. PATENT DOCUMENTS 4,068,288 A * 1/1978 Finnen ........................ 361/664
4,150,371 A * 4/1979 Scaglione ................. 340/545.6
4,803,632 A    2/1989 Frew et al.

(Continued)

FOREIGN PATENT DOCUMENTS

EP    0 549 519    6/1993

(Continued)

OTHER PUBLICATIONS

Italian Patent Application No. MI2001A.002726 filed Dec. 20, 2001. (no translation).

(Continued)

*Primary Examiner*—Vinh P Nguyen
(74) *Attorney, Agent, or Firm*—Nixon & Vanderhye P.C.

(57) ABSTRACT

Control meter for controlling the supply of services, in particular the supply of electric energy, having a support base, anchored with which is a main power supply line, and a metering group detachable from the support base and with a measurement apparatus interposed between the main power supply line and a subscriber line. A safety anchorage is provided for preventing fraudulent manipulations at the control meter and comprises mechanical means associated with the metering group and movable into a locking position for engagement with the support base when the metering group is mounted on the support base, and an interrupter for generating an activation signal upon activation by the mechanical means, wherein the mechanical means is arranged to activate the interrupter when the mechanical means is released from the locking position for detaching the metering group from the support base. The invention allows to positively obstruct acts of fraud and thus to provide a control meter which is able to permit the remote-control of the "open/closed" state in situations of fraud or rather attempted fraud and is capable of unequivocally proving the occurrence of fraud or attempted fraud.

18 Claims, 7 Drawing Sheets

U.S. PATENT DOCUMENTS 5,523,559 A    6/1996  Swanson
6,054,930 A *  4/2000  Guillon ...................... 340/637

FOREIGN PATENT DOCUMENTS

| EP | 0 723 358 A2 | 7/1996 |
|----|--------------|--------|
| WO | 98/10299 | 3/1998 |
| WO | 98/10394 | 3/1998 |
| WO | WO 99/46564 | 9/1999 |
| WO | 99/56564 | 11/1999 |
| WO | WO 03/055031 | 7/2003 |

OTHER PUBLICATIONS

International Search Report and Written Opinion for International Application No. PCT/EP2005/006102 dated Aug. 30, 2005.
European Search Report, Dec. 12, 2004.
Article 96(2), EPC Office Action, Aug. 2, 2006.
International Search Report of PCT/EP2005/006102, mailed Aug. 30, 2005.

* cited by examiner

CONTROL METER WITH SAFETY DEACTIVATION

This application is the US national phase of international application PCT/EP2005/006102, filed 7 Jul. 2005, which designated the U.S. and claims priority of EP 04014022.0, filed 15 Jun. 2004, the entire contents of each of which are hereby incorporated by reference

FIELD OF THE INVENTION

The present invention relates, in particular, to the field of the distribution of electrical energy to a plurality of subscribers distributed within the territory. The invention is, however, also applicable in more general terms to other services such as, for example, the distribution of water, gas or to teleheating. Thus, when mention will be made in the following of distribution services of electrical energy, it is understood that the teachings of the invention are easily applicable to the distribution of other services as well.

TECHNOLOGICAL BACKGROUND

Generally, meters for measuring consumption of electric energy are located in close proximity to the loads consuming the energy, e.g. in a generally accessible area of a home of a subscriber. The control meter is usually installed between a power distribution network and a subscriber line and measures the amount of electric energy drawn via the subscriber line.

Conventionally, authorized personnel manually read counter values of the control meter in predetermined time intervals, with the readings being used for billing subscribers for the consumed electric energy.

To reduce costs associated with reading the meters, techniques have been developed for remote control of the supply of subscribers with electrical energy. General problems of this type have already been described, for example, in Italian patent No. 1 232 195, filed on Oct. 26, 1988 by the present Applicant, or in U.S. Pat. No. 4,803,632.

The approach which these and other different studies have in common can be summarized in an architecture using heterogeneous forms of communication to establish a communication between the peripheral points of the system (meters at the subscriber points), with a supervision center being mainly responsible for the control of the procedures considered in each case to be useful for attaining the objects.

Such a connection is obtained by the direct communication between the supervision center (in general a server with high processor performance) and the peripheral meters, as is described, for example, in WO 98/10299, or by interposing at least one intermediate hierarchical level in this pyramid, as is suggested in WO 98/10394. Examples of these proposals can also be found in other patents such as e.g. EP-A2-0 723 358 or WO 99/46564. The general problem area of remotely controlling the supply of electrical energy is also dealt with in the recent Italian patent application No. MI2001A.002726 as filed on Dec. 20, 2001 in the name of the present applicant As noted above, meters are generally installed in an area accessible by subscribers and others and therefore it becomes an important issue to avoid fraudulent manipulations to the control meter aiming at drawing electric energy, which is not accounted for.

The most common ways to commit energy fraud require the removal of the metering point, the manipulation of the control meter to alter the measuring constant and/or circumventing the control meter by directly contacting the terminals the mains power supply line.

To counter these attempts of fraud, the technologies known today provide one single system consisting of mounting the apparatus for measuring the energy consumption on a support base which is closed by a lid fixed thereon by means of a seal. The discovery of the break of the seal proves the committed fraud that is then sanctioned according to the facts of the case.

This system has been considered to be sufficient in the past, when it was customary that the control meter was personally controlled and looked at by an operator at least once a month, even if only to read off the consumption. However, this system has proven to be inadequate when the energy supply companies considered the systematic control once a month of all meters in the network to be too costly and carried them out less frequently, for example, by asking each subscriber via telephone about his consumption.

At the current state of the art, which permits, as described in the aforementioned patent application No. MI2001A.002726, to remotely read the consumption and even to control the energy supply in real time, including the initiation and termination thereof, the safety system support based on a seal and the direct control of the control meter does not only become inadequate but it is even totally out of the question to propose such system.

A method and system for sensing removal of a utility meter from its socket is known from U.S. Pat. No. 5,523,559, according to which the removal of a meter can be detected by a tampering detection unit, wherein the tampering detection unit is included entirely within a base or base extension and external to the meter.

Further, a device for maintaining a device housing is known from EP 0 447 615 A1, according to which a sensor detects a position of a closure device for example used in meters for metering electricity, so that it may be detected when a housing is opened and the sensed state may be transmitted to the distributor.

SUMMARY OF THE INVENTION

It is an object of the present invention to provide for an improved detection of attempts of fraudulent manipulations of control meters.

A control meter for controlling the supply of services, in particular the supply of electric energy, comprises a support base anchored with which is a main power supply line, a metering group detachable from the support base and comprising a measurement apparatus interposed between the main power supply line and a subscriber line; and a safety anchorage comprising mechanical means associated with the metering group and movable into a locking position for engagement with the support base when the metering group is mounted on the support base; and an interrupter for generating an activation signal upon activation by the mechanical means, wherein the mechanical means is arranged to activate the interrupter when the mechanical means is released from the locking position for detaching the metering group from the support base.

Advantageously, the mechanical means further comprise a retaining spanner movable into retaining means in the support base in the locking position, to form a locking bar against displacement of the metering group of the control meter relative to the support base. The mechanical means may further comprise a locking bar mandrel cooperating with the retaining spanner and the interrupter of the safety anchorage such that the blocking/unblocking movement of the locking bar mandrel corresponds to the opening/closing movement of the interrupter. The locking bar mandrel may be arranged coaxially to the retaining spanner which, when the mechanical means is in the locking position, is urged against a seat of the support base to form a locking bar against a parallel movement of the metering group relative to the support base.

The retaining means may further comprise seats and a threaded bushing for receiving a threaded portion of the retaining spanner when the mechanical means is moved into the locking position.

Spring means may be provided, acting on the locking bar mandrel so as to move the locking bar mandrel in a direction away from the support base when the retaining spanner is released from the retaining means.

The interrupter and the mechanical means may be located substantially inside a sealed container with part of the locking bar mandrel and the retaining spanner being accessible though an opening in the sealed container; and the locking bar mandrel comprises a lid covering the retaining spanner, the retaining spanner being accessible for release from the locking position only by breaking the lid.

The interrupter may be formed by a pair of flexible metal sheets resiliently contacting each other, and the mechanical means being provided with a wing apt to interpose itself between the flexible metal sheets in the locking position.

In an alternative, the interrupter of the safety anchorage is formed by a micro-interrupter, the command button being activated by an oscillating arm moved by the mechanical means.

In another alternative the interrupter of the safety anchorage is formed by an optical transmitter and an optical receiver, forming a pair of optical devices with a transmitter-receiver coupling, and the mechanical means being provided with a wing apt to interrupt the transmitter-receiver coupling by interposing itself into the path between the optical transmitter and an optical receiver in the locking position.

Moreover, the metering group may be mountable on the support base by means of a bayonet-type attachment system with which the safety anchorage cooperates, the bayonet-type attachment system comprising a pair of hook-like members integral with one of the support base and the bottom wall of the body of the meter, and, two recessed members formed in the other one of the support base and the bottom wall of the body of the meter, facing the hook-like members, whereby the engagement of the hook-like teeth in the recessed members takes place due to a displacement of the body of the control meter parallel to the respective support base.

One of the support base and the metering group may comprise a series of resilient, fork-shaped supply terminals and the other one of the support base and the metering group comprises an opposing series of mandrel-shaped control meter input terminals for the subscriber line, whereby the anchoring movement of the bayonet-type attachment system also causes the mandrel-like terminals to be engaged in the opposing fork-shaped terminals.

The interrupter may form part of an electronic circuit that is associated with translating means to transmit the activation signal to a local control unit or remote central control, and may be arranged to irreversibly command, upon actuation, the opening of a power switch 52 of the subscriber side of the supply line.

The metering group may further comprise an electronic circuit for the memorization of the exchange of state of the interrupter, and may be supplied by a battery having a similar service life as the meter.

The metering group may include a measurement apparatus comprising translating means for transforming the values of the effected measurements into data to be transmitted via communication lines, and communication means associated with the translating means to perform an exchange of measurement data and possible other processing data with a remote central control connected to the control meter by means of a communication line.

The activation signal may command a local microprocessor or a microprocessor at a remote central control, provided with software for effecting the initiation and interruption of the energy supply, to interrupt the power supply to the control meter by opening the power switch.

Moreover, the software of the local control unit may provide the repetition of the control of the signal identifying the occurred actuation of the interrupter and/or of the electronic circuit (14), before emitting the command for interrupting the supply, and the repetition of the control may also provide the reset of the memorization circuit.

The invention allows to positively obstruct acts of fraud and thus to provide a control meter which is able to permit the remote-control of the "open/closed" state in situations of fraud or rather attempted fraud and is capable of unequivocally proving the occurrence of fraud or attempted fraud.

BRIEF DESCRIPTION OF THE DRAWINGS

Further features and advantages of the invention are, however, more easily apparent from the following detailed description of a preferred embodiment which is only given as an example without limiting the invention and which is illustrated in the accompanying drawings in which.

DETAILED DESCRIPTION OF THE PREFERRED EMBODIMENTS

In the following a first embodiment of the invention will be described with regard to FIGS. 1*a* and 1*b*.

Figure 1A:
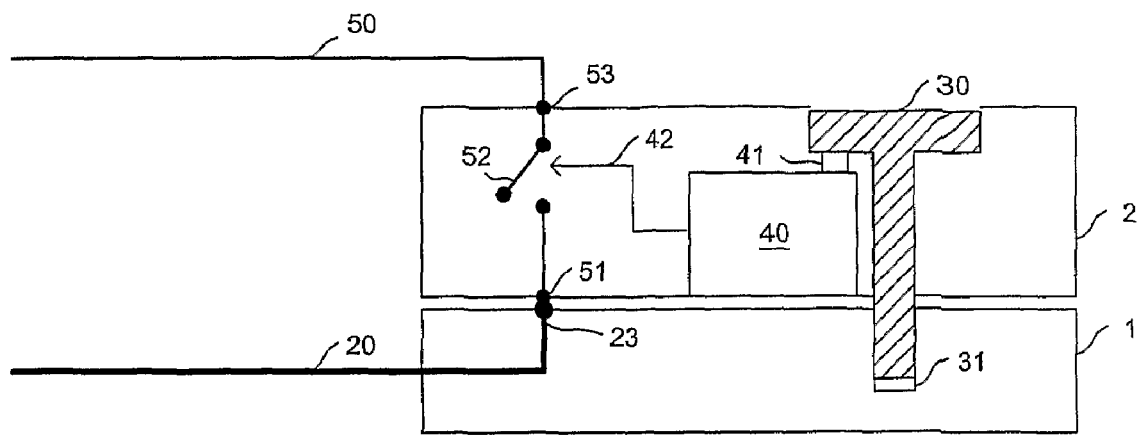
FIGS. 1*a* and 1*b* show diagrammatical longitudinal sections of a control meter according to an embodiment of the invention in the locked position and in the unlocked position, respectively.
Figure 1B:
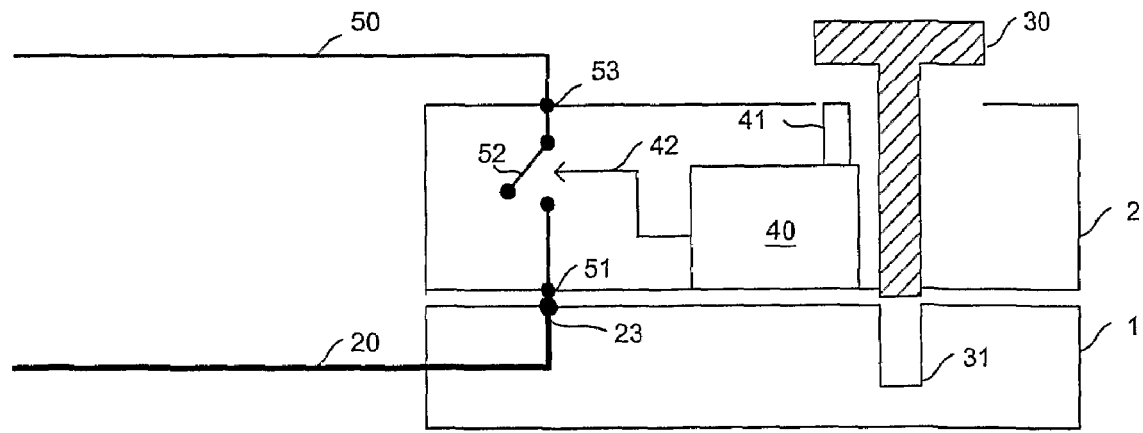

FIGS. 1*a* and 1*b* schematically show longitudinal sections of a control meter according to an embodiment of the invention, with FIG. 1*a* illustrating the control meter in the locked position and FIG. 1*b* illustrating the control meter in the unlocked position.

FIG. 1*a* illustrates a control meter comprising a support base 1 and a metering group 2. The support base may for example be fixedly mounted to a wall or control meter compartment, e.g. in a subscriber's home. The metering group 2 is detachably mounted on the support base 1, to be removed for servicing the control meter. Supply terminals 23 of a power supply line 20 are anchored with the support base 1.

The metering group comprises a measurement apparatus (not shown), interposed between the main power supply line 20 and a subscriber line 50. The measurement apparatus operates to account for electric energy drawn by a subscriber through the subscriber line. The subscriber line 50 and measurement apparatus are connected to the supply terminals 23 of the main power supply line via control meter input terminals 51 and, if the measurement group is mounted on the support base at the appropriate location, the terminals 23 and 51 are in contact with one another and electric power can be drawn by loads (not shown) connected to the subscriber line 50, such as appliances and similar. The subscriber line 50 is further controlled by a power switch 52, allowing to turn on and off a power supply to the subscriber line terminals 53, e.g. as controlled by a local control unit of the control meter or a remote central control operator for initiating and terminating a subscriber contract, and to turn off the power supply upon detecting an attempt of fraud, as detailed further below. The power switch 52 may be arranged in the metering group 2, as shown in FIG. 1a or, in an alternative, the power switch 52 may be arranged in an external protected compartment, or in the meter itself.

The metering group further comprises a safety anchorage for ensuring that the metering group is securely mounted on the support base. The safety anchorage prevents that fraudulent manipulations of the metering group, e.g. to avoid the drawing of electric power which is not accounted by the measurement apparatus, remain unnoticed.

The safety anchorage comprises mechanical means 30, associated with the metering group and movable into a locking position in a recess 31 of the support base, for locking engagement with the support base when the metering group 2 is mounted on the support base 1, i.e. the mechanical means can only be introduced into the recess 31, if the metering group 2 is properly positioned on the support base 1.

Further, the safety anchorage comprises an interrupter 40 for generating an activation signal upon actuation by the mechanical means 30, wherein the mechanical means activates the interrupter when the mechanical means is removed from the locking position in the recess 31, e.g. in an attempt to detach the metering group from the support base.

In FIG. 1a the mechanical means 30 is shown locked in the locking position and the switch 40 is shown in a non-activated position, indicated by the depressed switch element 41, being held in a depressed position between the mechanical means 30 and the interrupter 40. The switch element 41 can for example be resiliently urged by a spring in an upward direction in FIG. 1a while being held in a depressed position by the fact that the mechanical means 30 is in the locked position.

Furthermore, in the locking position shown in FIG. 1a, the power switch 52 of the subscriber line 50 is maintained closed, and electric power can flow from a supply network to the loads connected to the subscriber line 50, to be measured by the measurement apparatus.

The mechanical means 30 can for example be a retaining spanner or bolt with a threaded portion, the threaded portion for insertion into a threaded bushing in the recess 31. Thus, to bring the mechanical means 30 into the locked position, simply a screwdriver could be used.

In the example shown in FIG. 1a it is the flat-shaped head of the mechanical means 30 which functions as a means to keep the switch element 41 in a depressed, non-activated position, however, any other means for holding the switch portion in this position could be used, such as any other protrusion at the mechanical means 30 or element to maintain the interrupter in the non-activated position, when the mechanical means is in the locked position.

Turning to FIG. 1b, showing the control meter in the unlocked condition, the mechanical means 30 is removed from the recess 31 in the support base, and with the release operation the interrupter is activated, as indicated by the upward moved switch element 41. For example, when the mechanical means 30 is removed from the recess 31, a spring may move the switch element 41 in an upward direction, activating the interrupter 40.

It is an important feature that only with the mechanical means 30 in the position shown in FIG. 1b, i.e. removed from the recess 31 in the support base, the metering group 2 can be removed from the support base 1.

Further, with the release operation of the mechanical means 30 the interrupter 40 is activated and a corresponding activation signal is generated. The activation signal indicates that someone attempts to remove the metering group from the support base and it can appropriately be processed.

In the example shown in FIG. 1b, the activation signal is used to command an opening of the power switch 52 of the subscriber line 50 via a transmission line 42, turning off a supply of electric power to the subscriber line terminals 53 and thus to the external portion of the subscriber line and therewith to the subscriber. The interrupter may be arranged to irreversibly command, upon actuation, the opening of the power switch 52 of the subscriber line. Accordingly, fraud by drawing electric energy from the subscriber line terminals 53 without being fed through the measurement apparatus is prevented.

The power switch 52 may be a two-stage switch with a lever for manual activation/deactivation of the power supply and with a switch element driven by the interrupter for enabling/disabling the manual activation of the power supply. Further, the power switch 52 may form part of a fuse device for deactivation of the power supply in case of over current, or may be constituted by an element for triggering the fuse device.

In addition thereto, or as an alternative, the activation signal may also be forwarded to a local control unit or remote central control via a transmission line for further processing. The remote control center may also be used to remotely control the power switch 52 to open/close the subscriber line. It is noted that the remote control center may also control the power switch 52 to initiate or terminate a utility supply contract.

Still further, the activation signal and further data in association therewith, such as a time stamp of the occurrence of the activation signal, a counter value of the measurement apparatus and similar may be stored in non-volatile memory means in the local control unit of the control meter and/or at the remote control center.

In an alternate embodiment it may be preferred to irreversibly open the power switch 52 upon a first activation of the interrupter so as to prevent closing the power switch 52 upon again mounting the metering group on the support base. Further, a reset may preferably be devisable only by an operator via the remote control center or a similar entity.

Preferably, the safety anchorage is not accessible from the outside of the metering group, i.e., securely housed within a sealed casing of the metering group. This avoids access to and fraudulent manipulation of the safety anchorage in an attempt of unauthorized drawing of electric energy.

The interrupter, while in FIGS. 1a and 1b shown as a micro-switch, can be of any type suitable for detecting a removal of the mechanical means 30 from the recess 31 in the support base.

Still further, while FIGS. 1a and 1b show a recess in the support base for receiving the mechanical means 30, in alternative embodiments any other means for locking engagement with the mechanical means may be devised. For example, the support base may be provided with a protrusion extending into the metering group when mounted on the support base, and the mechanical means 30 may be brought into locking engagement with this protrusion. Thus, many different arrangements are possible, and the invention is not limited to the exact mechanical arrangement shown in FIGS. 1a and 1b.

In the following a further embodiment of the invention will be described with regard to FIG. 2.

Figure 2:
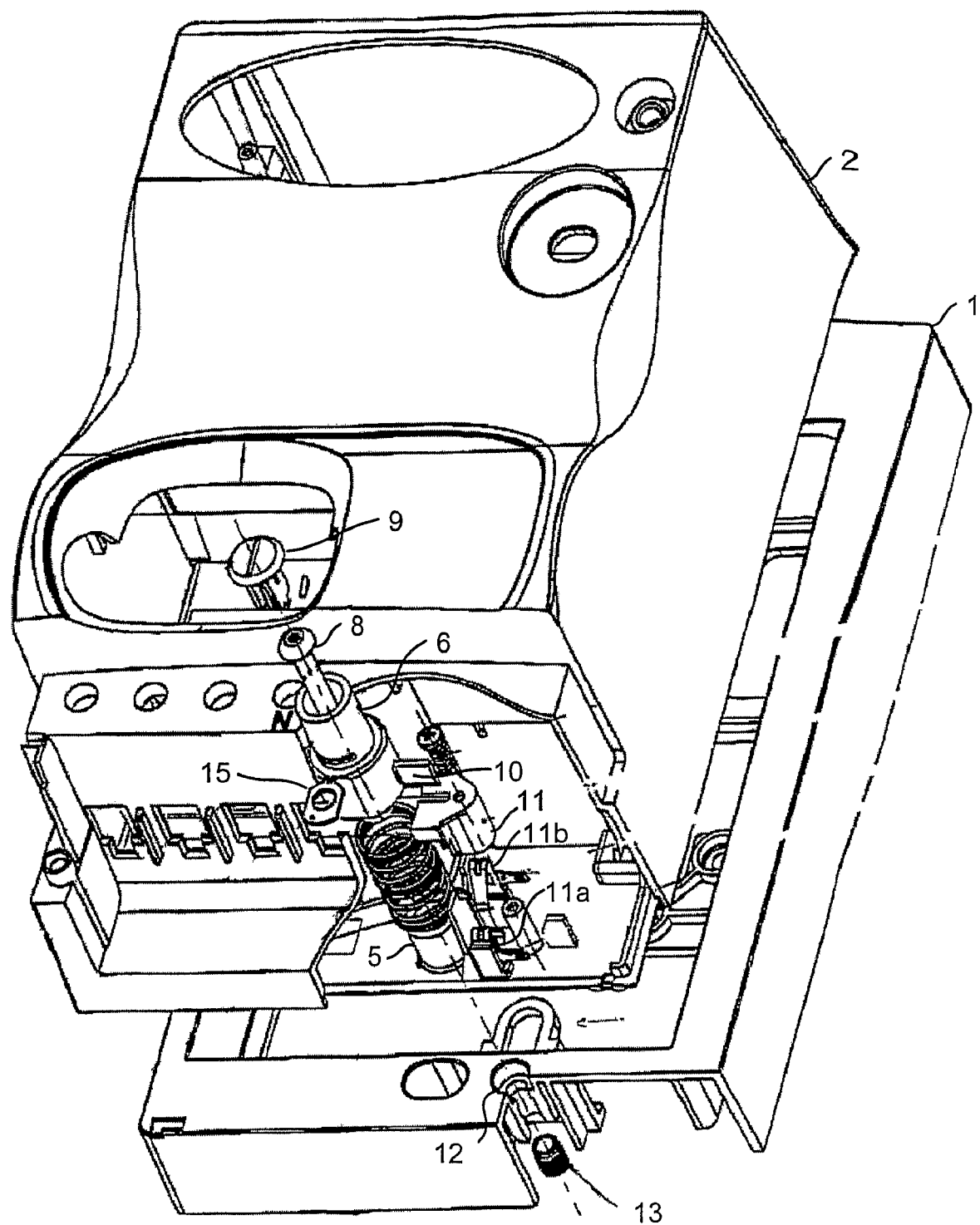
FIG. 2 shows a diagrammatic, exploded view in perspective of a control meter according to an embodiment of the invention.

FIG. 2 shows a diagrammatic, exploded view in perspective of a control meter, particularly illustrating elements of a safety anchorage.

The control meter of FIG. 2 comprises a support base 1 which can be attached to the wall, for example, by means of a series of V dowel-type screws in a manner known in the art. The support base includes an end portion and terminals of a main power supply line, e.g. operated by an energy providing organization, to allow the drawing of energy by a subscriber.

Further, the control meter comprises a metering group 2 comprising a box-like sealed casing accommodating the elements of the control meter for measuring operations. The sealed casing prevents access to the elements of the control meter for safety reasons, e.g. to prevent electric shock, and for security reasons, i.e. to prevent fraudulent manipulations to the meter. The metering group 2 includes a measuring apparatus for measuring a consumption of electric energy by the subscriber via a subscriber line connected to the terminals of the main power supply line through the metering apparatus, as known in the art.

Further, the metering group may include translating means for transforming the measured values of the effected measurements into data and transmitting means for exchanging data with a remote control center by means of an communication line, e.g. for remote accounting at the remote central control and subscriber billing. Further, the control meter preferably comprises a remotely operable device for interrupting/reactivating the power supply circuits. For example, the subscriber line power switch 52 may be remotely operable via a command from the remote control center, in addition to being operable via the interrupter.

The metering group 2 is mountable on the support base 1 by means of a bayonet-type attachment system or any other attachment system using screws, hooks and the like. In the mounted position, the subscriber can draw electric energy from the main power Supply line via the measuring apparatus and the subscriber line. In the detached position with the control meter removed from the support base, the terminals of the main power supply line are not in contact with the input terminals of the control meter, i.e., the subscriber line 50 and the drawing of electric energy through the metering group is not any longer possible.

However, as in the detached position the terminals of the main power supply line may be freely accessible, to prevent unauthorized drawing of electric energy, means must be provided to prevent or at least detect an unauthorized removal of the metering group from the support base.

The control meter therefore comprises a safety anchorage, shown in FIG. 2 in the exploded view. The safety anchorage comprising mechanical means associated with the metering group and movable into a locking position for engagement with the support base 1 when the metering group is mounted on the support base 1, and an interrupter for generating an activation signal upon actuation by the mechanical means. The mechanical means and the interrupter interact to generate an activation signal when the mechanical means is released from the locking position for detaching the metering group from the support base.

The safety anchorage of the embodiment of FIG. 2 preferably consists of the following elements in association with the measuring group:

A hollow seat 5 in the form of a bushing, integral with the bottom 2a of the group 2.

A mandrel-shaped hollow body 6, slidably accommodated in the seat 5. The mandrel 6 is more precisely provided with an axial perforation of small diameter in the lower part that enlarges in the upper part, forming a resting shoulder 6a. Spring means 7 which urge the mandrel 6 upwardly.

A retaining spanner 8 consisting preferably of a bolt, accommodated between the lower part of the axial cavity of the mandrel 6, with its head resting on the shoulder 6a. When the retaining spanner is loosened, its rising head pulls out the entire body 6, urged by the spring means, thus releasing it from its engagement with the support base 1.

A retainer part 15 with an opening in the middle portion thereof for allowing access to the retaining spanner 8 below, e.g. with a screwdriver. The retainer part 15 is insertable into an opening of the mandrel-shaped hollow body 6. Further, the opening of the retainer part 15 is smaller as the diameter of the retaining spanner 8, such that, when the retainer spanner 8 is loosened, its rising head engages with the retainer part 15 to force the mandrel 6 upward, in addition to the force by the spring means.

A lid 9 for sealing the upper part of the axial cavity of the mandrel 6. The lid is retained when it is being positioned in its accommodation above the retaining spanner such that its removal entails the break of the lid.

A wing 10 of insulating material, integral with the mandrel 6 and acting preferably in the radial direction towards the exterior of the mandrel 6.

And an interrupter 11, formed by a pair of metal sheets contacting each other and being moved apart by the wing 10, when the mandrel is urged downwards, the disposition and function of which will be described in more detail below.

Further, the safety anchorage of the embodiment of FIG. 2 comprises the following elements in the support base 1, on the same axis as the mandrel 6, to cooperate with the previously described elements in the measuring group:

A seat 12, constituting retaining means, for accommodating the lower end of the aforementioned mandrel 6.

And a seat 13, constituting retaining means, for anchoring the retaining spanner 8, which is comprised of an internally threaded bushing when the spanner 8 is a bolt.

The elements described above interact in such a manner that an activation signal is output, if the retaining spanner is removed from the seats 12 and 13.

Briefly, the retaining spanner is movable into the retaining means, i.e. the seat 13, in the locking position, to form a locking bar against displacement of the metering group relative to the support base. Further, the locking bar mandrel cooperates with the retaining spanner and the interrupter of the safety anchorage such that the blocking/unblocking movement of the locking bar mandrel corresponds to the opening/closing movement of the interrupter. Moreover, the locking bar mandrel is arranged coaxially to the retaining spanner which, when the mechanical means is in the locking position, is urged against a seat of the support base to form a locking bar against a parallel movement of the metering group relative to the support base. The retaining means may comprise a threaded bushing for receiving a threaded portion of the retaining spanner when the mechanical means is moved into the locking position.

Further, the spring means act on the locking bar mandrel so as to move the locking bar mandrel in a direction away from the support base when the retaining spanner is released from the seat 13.

The pair of flexible metal sheets resiliently contacting each other forms the interrupter, and the wing is arranged to interpose itself between the flexible metal sheets in the locking position. The interrupter and the mechanical means are located substantially inside a sealed container with part of the locking bar mandrel and the retaining spanner being accessible though an opening in the sealed container; and the lid covers the retaining spanner, the retaining spanner being accessible for release from the locking position only by breaking the lid.

In an alternative the interrupter of the safety anchorage is formed by an optical transmitter and an optical receiver, forming a pair of optical devices with a transmitter-receiver coupling, wherein a signal light is transmitted from the optical transmitter to the optical receiver. Further, in this alternative the mechanical means is provided with a wing apt to interrupt the transmitter-receiver coupling by interposing itself into the path between the optical transmitter and an optical receiver in the locking position. The remaining features and operations are substantially as outlined above.

The embodiment shown in FIG. 2 and its operation will now be further described with regard to FIGS. 3a, 3b and FIGS. 4a, 4b, respectively.

Figure 3A:
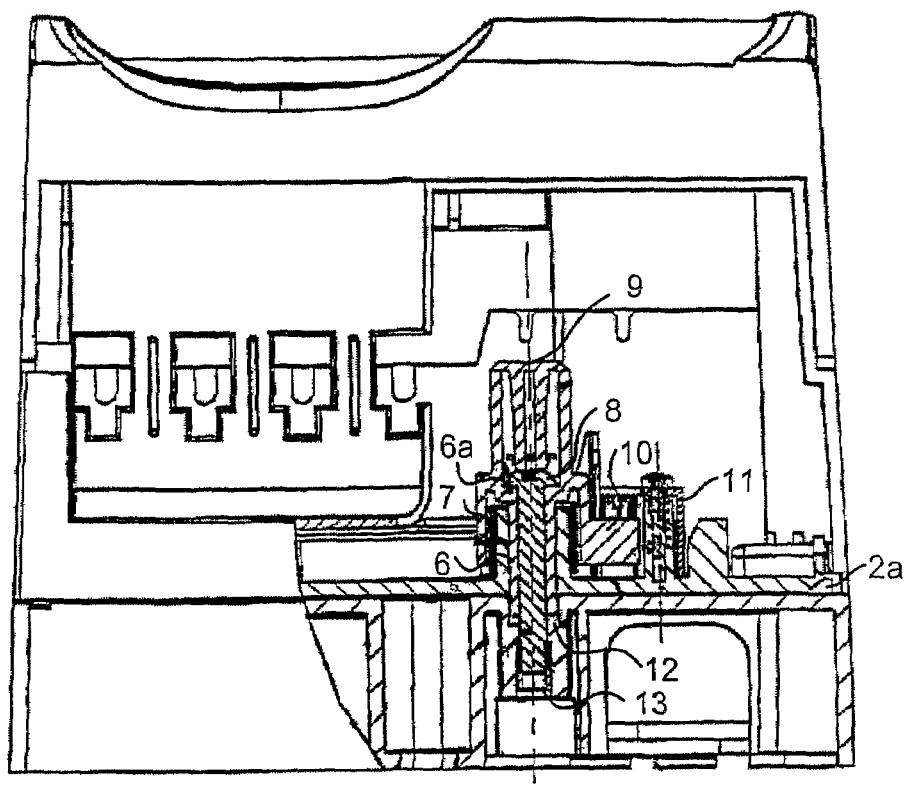
FIGS. 3*a* and 3*b* show a detail of the control meter of the embodiment in FIG. 2 in a cross-sectional view and perspective view, respectively, of the safety anchorage in the closed position.

FIG. 3a shows a detail of the control meter of FIG. 2 in a cross-sectional view of the safety anchorage in the closed position.

In the cross-sectional view shown in FIG. 3a, the metering group 1 is mounted on the support base 2 and the safety anchorage is in its locked position.

In the locked position, the retaining spanner 8 is locked in the seat 13 of the support base, e.g., by way of threading and turning the retaining spanner using, e.g., a screwdriver. In this position, the retaining spanner 8 urges the mandrel-shaped hollow body 6 in a downward direction, against the force of the spring 7, until the mandrel-shaped hollow body 6 rests on the seat 12 in the support base 2. In this position, the metering group 1 cannot be removed from the support base 2.

The downward movement of the mandrel-shaped hollow portion 6 is effected by a head portion of the retaining spanner 8 resting on the shoulder 6a of the mandrel.

Further, with the downward movement of the mandrel 6 the wing portion 10 of the mandrel is also moved in a downward direction and eventually moved between the pair of metal sheets of the interrupter 11, forcing the metal sheets out of electrical contact with one another, as the wing portion 10 is made of insulating material. In the position shown in FIG. 3a, the interrupter 11 is in the non-activated position, i.e. the "normal" position, when the metering group is mounted on the support base and the safety anchorage in the locked position.

The lid 9 is inserted into a top portion of the mandrel-shaped hollow body, above the retaining spanner 8, to prevent access to the retaining spanner from the outside. The lid 9 can be removed from this position covering the retaining spanner only by breaking the lid, and therefore effectively provides a lid, as known in the art.

Figure 3B:
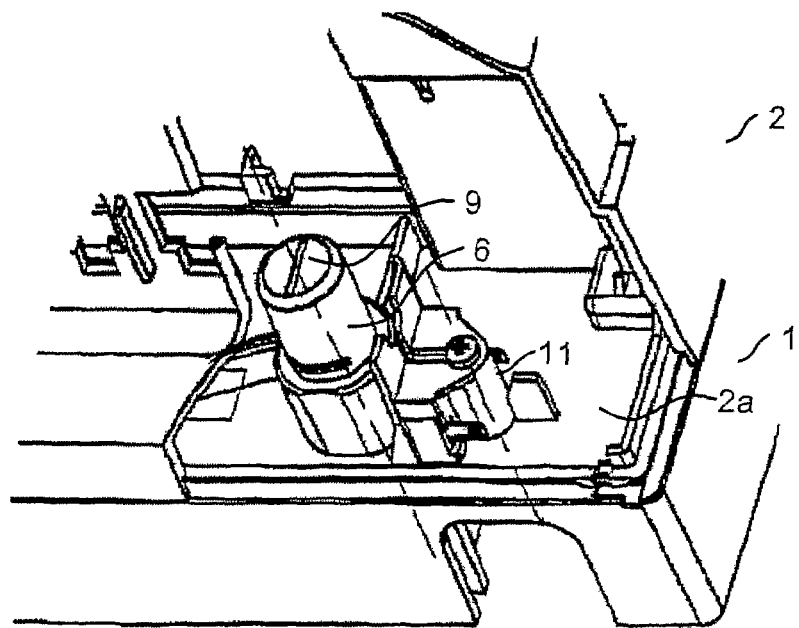

FIG. 3b shows a detail of the control meter of FIG. 2 in a perspective view of the safety anchorage in the closed position.

In the perspective view of FIG. 3b, the outside of the mandrel-shaped hollow body is visible, with the wing portion made of insulating material moved into the interrupter, of which the cover 11 is visible. The mandrel 6 and the cover 11 rest on a support base portion 2a of a casing of the metering group.

Finally, FIG. 3b shows the lid 9 in the inserted position above the retaining spanner.

In the perspective view of FIG. 2, the sealed casing of the metering group is cut out for illustration purposes. An access to the safety anchorage will only be possible through a small opening, e.g., in the top wall of the sealed casing, such as with a screw-driver to turn the retaining spanner 8, and insertion/removal of the lid 9.

Figure 4A:
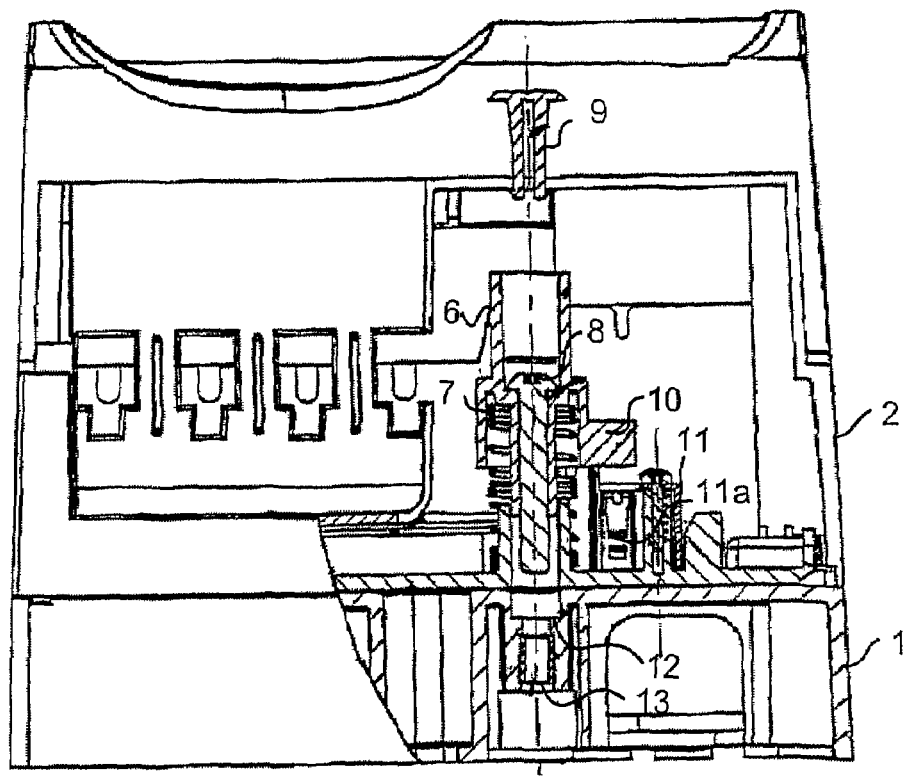
FIGS. 4*a* and 4*b* show the detail of the control meter shown in FIGS. 3*a* and 3*b* respectively in the open position.

FIG. 4a shows a detail of the control meter of FIG. 2 in a cross-sectional view of the safety anchorage in the open position.

The cross-sectional view of FIG. 4a illustrates the metering group 2 still in contact with the support base 1, however, with the safety anchorage in an unlocked position, allowing a removal of the metering group 2 from the support base 1. In the unlocked position, the retaining spanner 8 is removed from the seat 13, e.g., by unscrewing the spanner using a screwdriver. With the resilient force of the spring 7, the mandrel-shaped hollow body 6 is likewise moved in an upward direction, out of the seat 12 in the support base 1. Further, when the retainer spanner 8 is loosened, its rising head engages with the retainer part 15 inserted into the mandrel 6 above the retainer spanner, as shown in FIG. 2, and the mandrel 6 is forced upward in addition to the force by the spring means.

When the retaining spanner 8 and the mandrel 6 are removed from their seats in the support base, the metering group 2 can be moved parallel and/or perpendicular with regard to the support base 1, for removal of the metering group.

Further, with the mandrel-shaped hollow body 6 moved upwards by way of the resilient force of the spring, the wing portion 10 of the mandrel 6 is also moved in an upward direction and out of the space between the two metal sheets 11. Accordingly, the metal sheets 11 move into electric contact with one another. The position of the wing 10 must be such that an electric contact between the metal sheets 11 is established before or at the full removal of the mandrel 6 and retainer spanner 8 from their respective seats 12 and 13, so that it is assured that the electric contact is established at a point or before the metering group can actually be removed from the support base 1. The removal of the mandrel 6 and retainer spanner 8 from their respective seats 12 and 13 is supported by the spring 7 and the retainer part 15 engaging with the rising head of the retainer spanner 8.

When the metal sheets 11 contact one another, the interrupter switches into the activated state and outputs an activation signal. The activation signal can, e.g., be generated by a current, which is allowed to flow between the metal sheets.

This activation signal can then be output for further processing and/or can be used for opening a power switch, as detailed with regard to the embodiment of FIGS. 1a and 1b.

Figure 4B:
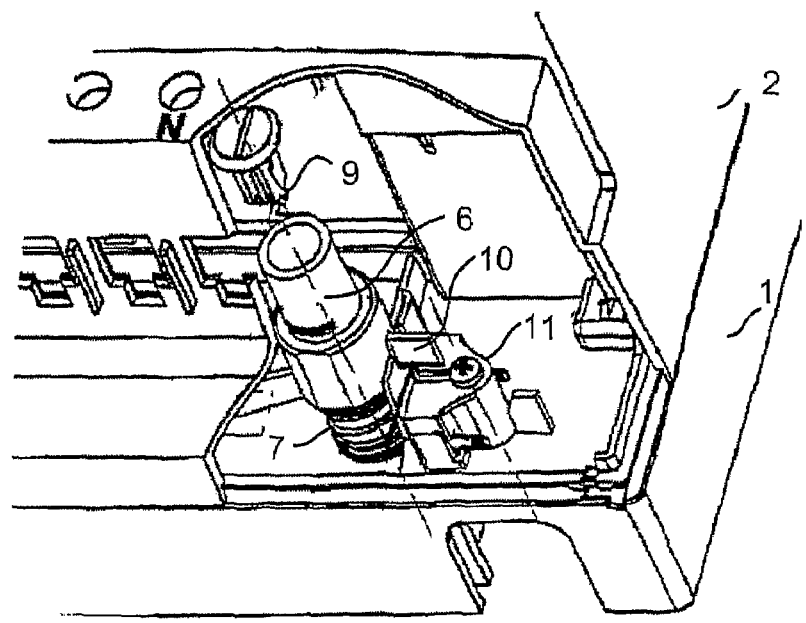

FIG. 4b shows a detail of the control meter of FIG. 2 in a perspective view of the safety anchorage in the open position.

The perspective view of FIG. 4b illustrates a portion of the support base 1 and the metering group 2, with a portion of the casing of the metering group cut out for illustration purposes.

In FIG. 4b, as in FIG. 4a, the metering group 2 is still in a position on the support base 1, however, with the safety anchorage in the unlocked position, as detailed before. The lid 9 is removed from the mandrel-shaped hollow body 6, e.g., by breaking the lid, and the retaining spanner is removed from its seat in the support base. The resilient force of the spring 7 moves the mandrel-shaped hollow body 6 in an upward direction, and removes the wing portion 10 from the space between the metal sheets of the interrupter.

In the following, a further embodiment of the invention will be described with regard to FIGS. 5a and 5b.

Figure 5A:
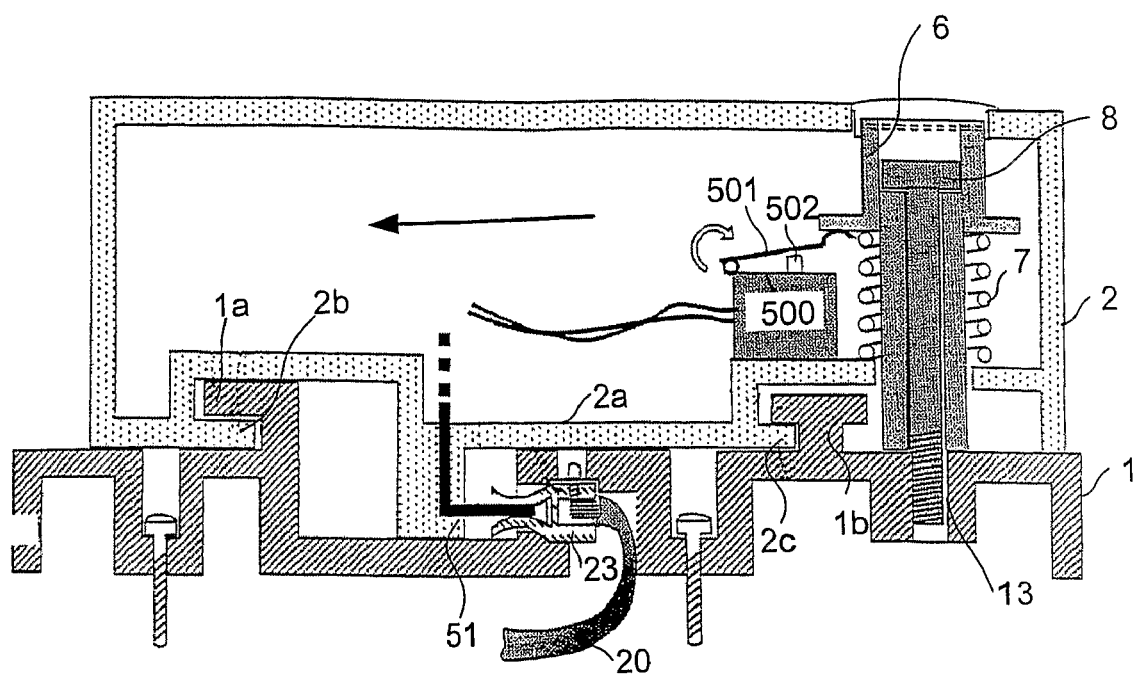
FIGS. 5*a* and 5*b* show diagrammatical longitudinal sections of a control meter according to another embodiment of the invention in the locked position and in the unlocked position, respectively.
Figure 5B:
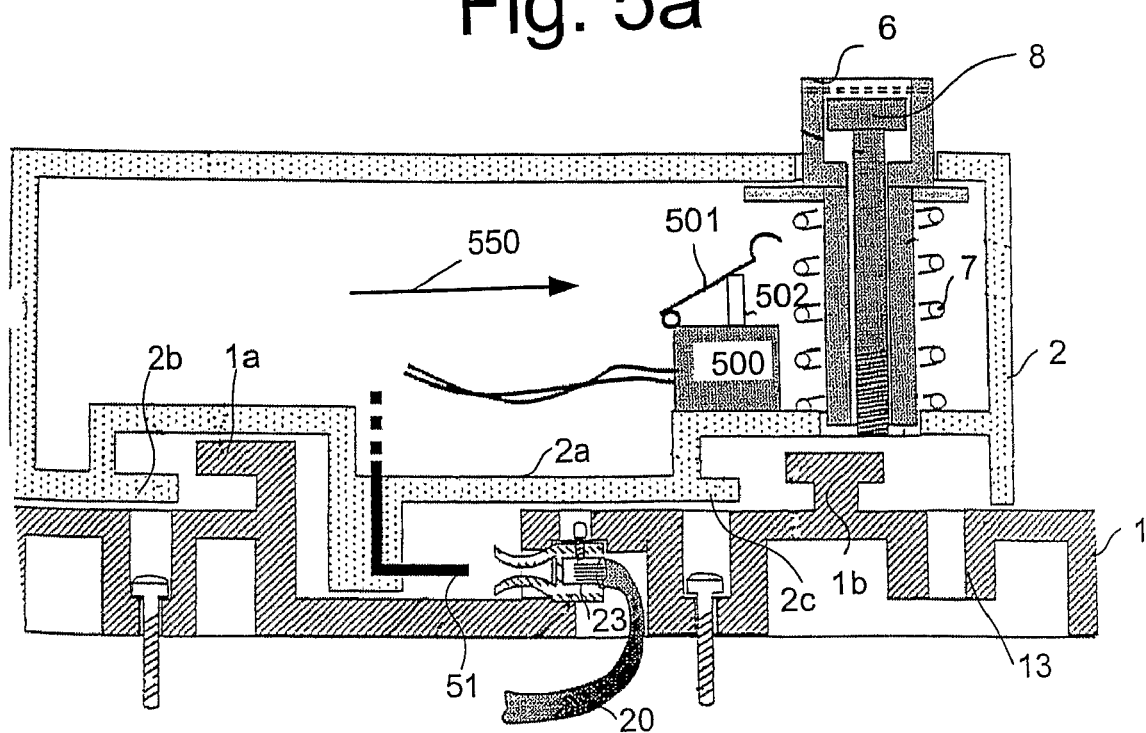

FIGS. 5a and 5b show diagrammatical longitudinal sections of a control meter according to another embodiment of the invention in the locked position and in the unlocked position, respectively.

The elements described in detail above with reference to FIGS. 2 to 4b are also illustrated very diagrammatically in FIGS. 5a and 5b that show the mandrel-shaped body 6 with the respective bolt 8, the spring 7 and the threaded seat 13 for anchoring the bolt 8.

However, differing from the previous embodiments, FIGS. 5a and 5b do not display the pair of metal sheets 11 forming the interrupter, but represent a variant comprised of a micro-interrupter 500 with an operation press-button, subject to the actuation by an oscillating arm 501 which is, in turn, commanded by the movement of the mandrel 6.

The metering group 2 is mountable on the support base 1 by means of a bayonet-type attachment system. As is schematically shown in FIGS. 5a and 5b, this system comprises, on the one hand, a pair of hook-like members 2b, 2c integral with the body 2 (for example, formed in one piece in the cast of the bottom wall 2a of the floor of the body 2), and, on the other hand, two recessed members 1a, 1b facing each other and formed in the support base 1.

FIG. 5a shows how the group 2 can be mounted on the support base 1, with the members 2b, 2c being vertically spaced from the members 1a, 1b. FIG. 5b shows, on the other hand, how the teeth 2b, 2c engage in the recesses 1a, 1b, after the group 2 has shifted from the top to the bottom on the support base 1, thus blocking the group 2 on the support base 1 against movement perpendicularly or obliquely to the supporting wall of the support base 1. The safety means according to the invention, which will be described in more detail below, is provided to prevent the group 2 from moving in the opposite direction, i.e. from the bottom to the top.

The support base 1 carries a series of terminals 23 (only one of which is depicted in the drawing for the purpose of simplification) to which the ends of the conductors 20 of the main power supply line are attached; in the case of a single phase supply line, there are only two terminals, whereas in the case of a three-phase supply line there are obviously four terminals provided. As is evident from FIGS. 5a and 5b, the supply terminal 23 is realized in the form of a resilient fork with which the mandrel-shaped control meter input terminal 51 of the supply line situated inside the body 2 of the control meter is apt to cooperate, engaged therewith. When the body 2 is only resting on the support base 1 (beginning of the mounting phase as illustrated in FIG. 5b), these terminals 23 and 51 are free, whereas the terminals 51 are engaged in the opposing terminals 23 when the body 2 is caused to shift on the support base 1 where it is then hooked and blocked (FIG. 5a).

As can be seen in FIG. 5a, with the safety anchorage in the locked position, the mandrel 6, which is moved downward by the retaining spanner 8, depresses the oscillating arm 501 and holds the oscillating arm 501 in the depressed position, holding the micro-switch in the non-activated condition.

In contrast, as shown in FIG. 5b, when the safety anchorage is in the unlocked position, i.e. the retaining spanner 8 and mandrels 6 are removed from the support base, the oscillating arm 501 of the micro-switch can move upward, e.g., by the force of a spring 7, and the switch changes into the activated condition.

Again, the transition from the non-activated condition of the switch to the activated position of the switch must take place before the retaining spanner 8 and mandrels 6 are removed from the support base.

In the following, a sequence of steps necessary for mounting the metering group on the support base will be described with regard to FIGS. 5a and 5b. A reversal of these steps allows removing the metering group from the support base.

To mount the control meter in accordance with the invention, the support base 1 is initially fixed, for example, to a wall, the conductors of the energy supply line are connected to the supply terminals 23 integral with the support base 1.

Thereupon, the metering group 2 is brought to rest on the support base 1, in the position as illustrated in FIG. 5b; then, taking into account the elements described above, the following steps are carried out:

- the group 2 is moved from the top to the bottom in the direction indicated by the arrow 550 in FIG. 5b, to achieve the interlocking of the group 2 on the support base 1, similarly to a bayonet-type coupling. One also obtains at the same time the engagement of the control meter input terminals 51 in the supply terminals 23, thus energizing the entire group 2;
- an appropriate device such as e.g. a screwdriver, then acts upon the bolt 8, which constitutes an anchor spanner, by exercising initially a pressing action from the top to the bottom, against the resistance of the spring 7 which is compressed thereby. Thanks to its movement perpendicularly to the support base, the mandrel 6 forms in practice a blocking bar, its lower end engaging in the subjacent housing seat 12, thus achieving the retention of the body 2 against any possible shifting movement relative to the support base 1; the insulating wing 10 simultaneously interposes itself between the pair of resilient metal sheets 11 in mutual contact, in order to space them from each other and to thus open the interrupter formed by the pair of metal sheets 11;
- the screw driver is then turned to screw the bolt 8 into the threaded seat 13 as far as it will go and thus to also reliably secure the interrupter according to the invention in the safety position. As mentioned above, the engagement of the mandrel 6 in the seat 12 ensures in the first place that the group 2 is mechanically blocked on the support base 1; in fact, the group 2 cannot move parallel to the plane of the support base 1, resting thereupon, since it is prevented therefrom by the mandrel 6 which is engaged in the seat 12, nor can it be raised from the plane of the support base 1 since this is prevented by the dents of the bayonet-type coupling.

Moreover, the engagement of the insulating wing 10 between the contact sheets of the interrupter 11 keeps the latter open which, integrated in an electric safety circuit, enables supply of a "non-operative" signal to a local control unit such as a microprocessor which belongs to the general control system of the meter, as will be described in more detail below.

It becomes clear from the description given above, taking as a starting point that any attempt of fraud requires initially that the entire body 2 of the control meter be removed from its support base 1, then the following steps must necessarily be taken: above all, the lid 9 must be broken and then the retaining spanner in the form of the bolt 8 must be unscrewed; the mandrel 6 can then be expelled from the seat 12 due to the action of the spring 7, thereby releasing its lower end from its engagement in the seat 12 of the support base 1. However, in doing so, the wing 10 of insulating material also rises, departing from the metal sheets 11 of the respective interrupter and the latter closes. In the variant as shown in FIGS. 5*a* and 5*b*, the expulsion of the mandrel 6 under the action of the spring 7 analogously removes the mandrel 6 from the oscillating arm 501 which permits the press-button 502 to rise again, allowing thus the micro-interrupter 500 to be closed. Only then is it possible that the group 2 is shifted on the support base 1, releasing it from its bayonet-type engagement, and that the group 2 is lifted to access the supply terminals 23.

It is important to emphasize here that this "anti-tampering" safety support based on closing the interrupter 11 or 11*a* immediately after having released the spanner 6 and hence even before the body 2 is or can be shifted relative to the support base 1, is not only efficient in the case of an attempt of fraud consisting in a removal of the measuring point which requires, as previously stated, that the supply terminals 23 be directly accessed on the support base 1, but also in the case of an attempt of fraud consisting in a manipulation of the control meter to alter the measuring constant. It must in fact be taken into consideration that this manipulation also requires that the control meter be removed from its support base 1 since the control meter is sealed and cannot be opened and it must be forced open at the rear part so that no clear signs thereof are apparent. It must hence be followed from this that the device according to the invention efficiently prevents the fraudulent consumption of energy in any and all possible cases.

According to an alternative, the arrangement of the hook-like members and the recessed members may be reversed, i.e., the metering group may be mountable on the support base by means of a bayonet-type attachment system with which the safety anchorage cooperates, the bayonet-type attachment system comprising a pair of hook-like members integral with the support base, and, two recessed members formed in the bottom wall of the body of the meter, facing the hook-like members, whereby the engagement of the hook-like teeth in the recessed members takes place due to a displacement of the body of the control meter parallel to the respective support base.

Still further, in an alternative the metering group comprises a series of resilient, fork-shaped supply terminals and the support base comprises an opposing series of mandrel-shaped control meter input terminals for the subscriber line, whereby the anchoring movement of the bayonet-type attachment system also causes the mandrel-like terminals to be engaged in the opposing fork-shaped terminals.

In the following a further embodiment of the invention will be described with regard to FIG. 6.

Figure 6:
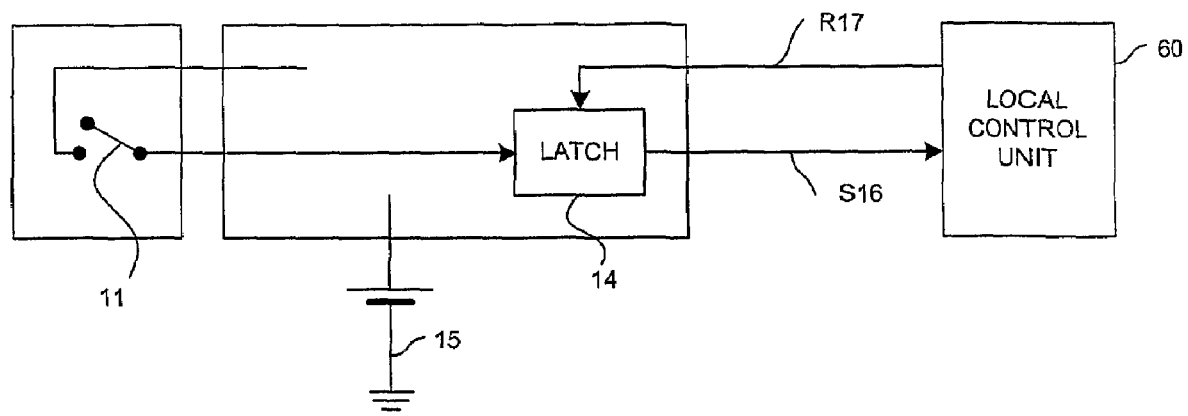
FIG. 6 displays the logical functional principle of the anti-tampering system according to an embodiment of the invention.

FIG. 6 shows the logical functional principle of the anti-tampering system according to another embodiment of the invention.

FIG. 6 illustrates the interrupter 11 and an electronic circuit 14, e.g. a latch, EEPROM, etc, for memorizing a transition of the interrupter 11 from the non-activated state to the activated state. The electronic circuit 14 is connected to one terminal of the interrupter, the other terminal of which is connected to a main power supply (not shown) and a battery 15. The battery 15 supplies energy for the operation of the switch 11 and electronic circuit 14 in case of a failure or disconnection of the main power supply so that the switch 11 and the electronic circuit 14 can continue to detect and memorize the actuation state, i.e. the activated or non-activated state.

The electronic circuit 14 is also connected to a local control unit 60 of the control meter and reports its actuation state or a transition of its state to the local control unit 60. The local control unit may be a microprocessor unit or the main processing unit of the meter and is connected to the main power supply.

Further, the control unit 60 is connected to the electronic circuit 14 to transmit a reset signal to the electronic circuit 14, for resetting the electronic circuit 14 from the activated state into the non-activated state.

It can be seen in the logical principle illustrated in FIG. 6 that closing the interrupter 11 causes the activation of the electronic circuit 14. It is the object of this circuit 14 to memorize the change of state of the signal corresponding to the opening of the interrupter 11. Further, this result is immediately transmitted as a signal S16 to the local control unit, where it is stored and maintained and processed until the reset R17 is subsequently activated.

The uninterrupted operation of this part 11, 14 of the circuit is ensured by the supply of the battery 15 which is incorporated in the circuit and preferably has a service life equal to that of the meter.

As stated above, the activation of the circuit 14 causes a signal S16 to be immediately transmitted via the communication line to the local control unit 60. The software of the microprocessor of this unit 60, which receives the signal S16, processes the signal just as a command to interrupt the supply of energy, and actually causes this interruption.

In the following an exemplary operation of the control meter will be described.

At first it is assumed that the metering group is mounted on the support base and the safety anchorage is in its locking position, the switch 11 is in the open position, e.g. the micro-switch of FIG. 1 or FIG. 5 is not activated or the wing 10 of FIGS. 2-4*b* is inserted between the metal sheets 11*a* and 11*b*. Further, the electronic circuit 14 is considered to be in the reset, non-activated state, e.g. by way of a reset signal transmitted from the local control unit or remote control center after the control meter has been installed and/or serviced by maintenance personnel.

In this "normal" state electric energy can be drawn from the power supply line via the measuring apparatus and the subscriber line. Use of electric energy is measured and reported to the remote control center and appropriate billing statements can be generated for the subscriber.

Now it is assumed that the safety anchorage is released from the locking position, to remove the metering group from the support base. Releasing the safety anchorage causes an activation of the switch, e.g. the micro-switch of FIG. 1 or FIG. 5 is activated or the wing 10 of FIGS. 2-4*b* is removed from the space between the metal sheets 11*a* and 11*b*.

This closing of the switch 11 applies the voltage from the battery 15 or from the main-power supply to the electronic circuit 14 and sets it into the activated state. The activation of the electronic circuit is immediately reported to the local control unit and may also be transmitted to a remote central control, which may appropriately process the activation signal. The remote central control may for example be a central control facility or administrator responsible for managing a plurality of control meters.

For example, the local control unit or remote central control may command an interruption of the power supply to the subscriber supply line by means of opening the power switch 52. In addition to reporting the signal, a time stamp of the activation may be recorded, a counter value of the measurement group and similar.

According to another embodiment, the circuit arrangement of FIG. 6 is further suited to avoid a report of spurious signals as tampering signals from the local control unit to the remote control center, as outlined in the following.

During normal operation, when a main power supply to the control meter is switched on and supplies electric energy to its components, upon removing the metering unit from the meter base, the switch 11 is closed and correspondingly an activation signal is supplied and held in the electronic circuit 14 and the activation signal is reported as signal S16 to the local control unit 60. Upon receiving the activation signal S16 the local control unit 60 generates a reset signal R17 to reset the electronic circuit 14. This reset signal may be transmitted immediately upon receiving the activation signal S16 or delayed by a predetermined amount of time, such as 200 ms. The reset signal 17 will reset the electronic circuit 14 into the non-activated state, however, as the switch 11 will be still closed due to the removal of the meter, the electronic circuit 14 will be activated again and the activation signal S16 will be again transmitted to the local control unit 60.

This cycle of transmitting the activation signal S16 and resetting the electronic circuit 14 via the reset signal R17 will therefore be repeated a plurality of times with an internal counter of the local control unit 60 counting the set/reset operations and, if a certain number of reset operations is reached, the tamper signal is generated. For example, a sequence of five to twenty five reset operations could be used as a limit value for the counter, and if this limit value is exceeded, the tamper signal is generated. However, it is noted that any other number of set and reset operations could be used as a limit, upon which the tamper signal is generated.

Accordingly, the circuit allows to detect a prolonged closing of the switch 11, e.g. for more than one or five seconds, corresponding to the time required for the number of reset operations selected as limit before generating the tamper signal. Only if the switch 11 remains closed for more than this time frame, the tamper signal will be generated. Of course, this time frame will be selected such that a manipulation of the control meter within the time limit is not possible.

In the following a case will be considered where a spurious signal activates the electronic circuit 14. A spurious signal could for example be generated by electromagnetic induction or any other event different from opening the switch 11 that activates the electronic circuit 14. This spurious signal is considered to be present only for a brief amount of time, e.g. a few milliseconds or similar.

Occurrence of the spurious signal will activate the electronic circuit 14 and the activation signal S16 will be transmitted to the local control unit 60. Upon receiving the activation signal S16, the local control unit 60 will transmit a reset signal R17 to the electronic circuit 14, to reset the electronic circuit 14. As the spurious signal only has a short duration, at the time of the reset operation the spurious signal may have vanished or vanishes after very few reset operations of the electronic circuit 14 and thus after one or a few reset operations the electronic circuit 14 will again remain in the non-activated state.

Erroneous generation of the tamper signal therefore is avoided, as long as the spurious signal does not exceed the time limit or number of reset operations used as a limit value.

According to another embodiment the local control unit 60 is adapted to perform the sequence of reset operations, i.e. to transmit the reset signal R17 to the electronic circuit 14, only in case the main power supply is switched on without an interruption. This prevents an unauthorized person from deliberately switching off the main power supply to the meter, in an attempt to avoid detection of closing the switch 11 when removing the metering unit from the base.

This also prevents an unauthorized person from removing the meter unit from the support base during a power outage, e.g. when for maintenance reasons the electric network is down.

In this case it is considered that the main power supply is switched off and thereafter the metering unit is removed from the base. As the switch 11 is connected to the battery 15, removing the metering unit from the base during the absence of the main power supply, will also activate the electronic circuit 14, and, since the electronic circuit 14 is also connected to the battery 15, the electronic circuit 14 will hold its activated state.

Moreover, after again switching on the main power supply, the local control unit 60, detecting the power outage, refrains from transmitting the reset signal R17 to the electronic circuit 14, in order to avoid resetting the electronic circuit 14, for example if the switch 11 is again open before turning again on the main power supply.

In this case the local control unit 60 will only operate to detect the activation signal S16 from the electronic circuit 14 and directly report the tampering signal to the remote central control.

Further, after detecting the end of the power outage, the control meter may resume the operations to suppress spurious signals, i.e. the sequence of reset operations, if upon the end of the power outage the activation signal S16 was not detected.

According to another embodiment, in order to further avoid the unintended transmittal of a tampering signal due to spurious signals occurring during a short failure of the main power supply, the local control unit 60 is adapted to only refrain from transmitting the reset signal R17 in the presence of an absence of the main power supply of more a certain amount of time, for example one or five seconds, i.e., a time limit too short for removing the metering unit from the base, manipulating the metering unit and reapplying the metering unit to the base. Thus, occurrence of spurious signals activating the electronic circuit 14 during the absence of the main power supply will not lead to the transmission of a tampering signal to the remote central control, thus avoiding erroneous reports of tampering attempts during short absence of the main power supply.

In the following a further embodiment of the invention will be described with regard to FIG. 7.

Figure 7:
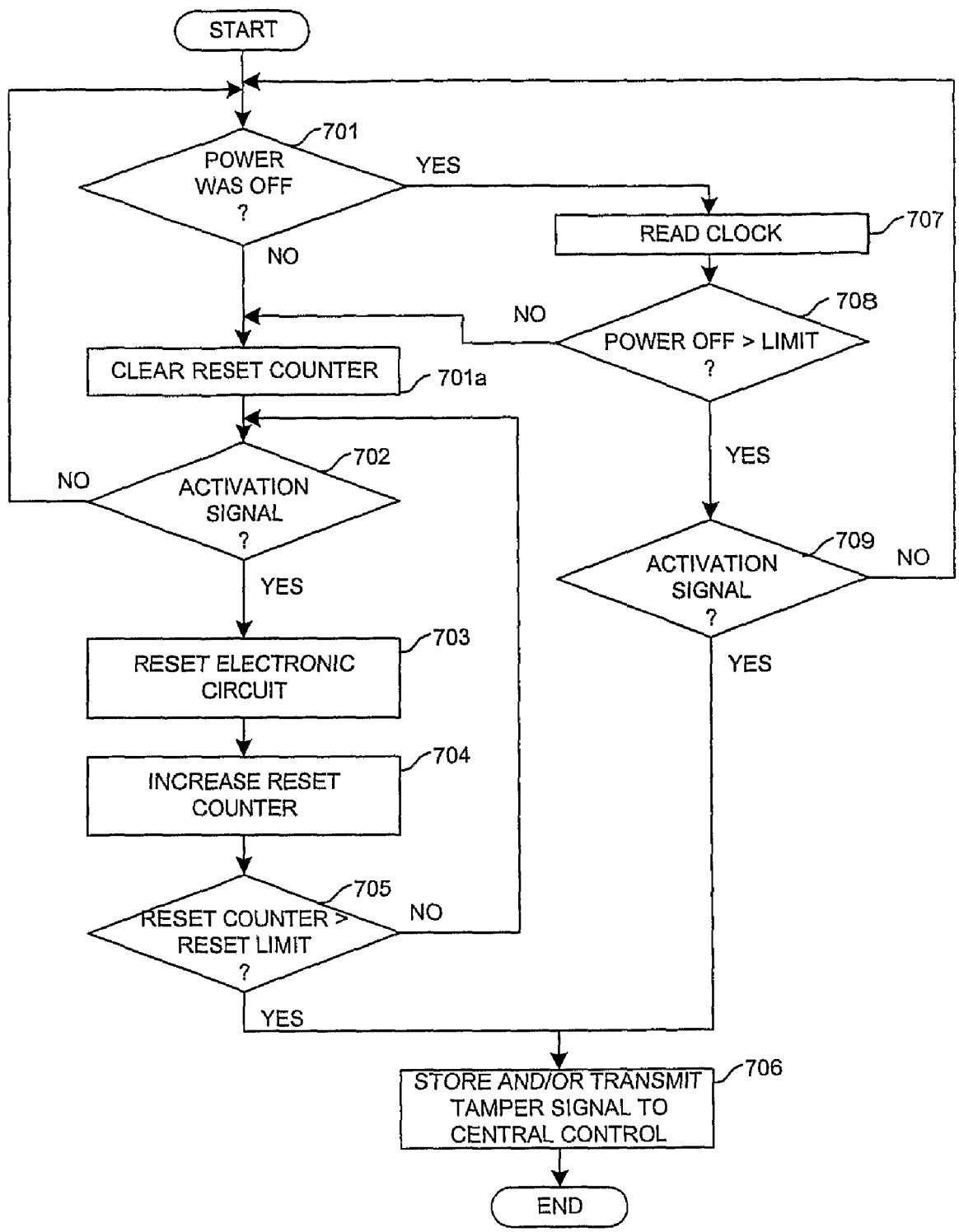
FIG. 7 is a logical diagram of the processing of the anti-tampering signal according to an embodiment of the invention.

FIG. 7 shows a flow diagram of operations carried out at the local control unit of the control meter to detect tampering with the control meter during a power-on and/or power-off situation, for example by the circuit arrangement shown in FIG. 6.

In a first operation 701 the local control unit determines whether a power-off condition was present. A power-off condition could for example be the failure or deliberate turnoff of a main power supply or could be any other interruption of the power supply to the local control unit. A power-off condition can for example be detected by the local control unit by checking a power-on flag stored in a memory of the local control unit, the power-on flag being maintained during a power on condition and being cleared upon a power failure.

If in operation 701 it is determined that a power-off condition did not occur, i.e., that the power supply to the local control unit was continuously switched on, in an operation 701a a reset counter is cleared and in an operation 702 it is determined whether an activation signal is received from an electronic circuit such as the electronic circuit 14 of FIG. 6, the electronic circuit latching the activation signal upon removal of the metering unit from the base, i.e., when closing the switch 11 of FIG. 6.

If in operation 702 the presence of the activation signal is detected, in an operation 703 the local control unit resets the electronic circuit 14. The reset operation can be carried out via the signal R17 shown in FIG. 6.

Thereafter, in an operation 704 the reset counter counting the number of times of resetting the electronic circuit is incremented. Preferably, before operations start, this counter was appropriately cleared. For example, the reset counter could be cleared before or after operation 701.

Thereafter, in an operation 705 it is determined whether the reset counter exceeds a reset limit, such as the reset limit described with regard to FIG. 6. The reset limit is preferably selected such that the time duration of the reset operations until the reset limit is exceeded is shorter than a time period required for removing and manipulating the metering unit. For example, if such a time limit is considered to be one second and if a reset cycle of the electronic circuit has a duration of 100 ms, then the reset limit would appropriately be set to ten, as after ten reset operations the one second time limit is reached. However, this is an example only and any other reset limit could be used.

If it is determined in operation 705 that the reset counter exceeds the reset limit, a tamper signal is generated, indicating that the metering unit was removed from the meter base for more than the selected limit. The tamper signal can be stored in a permanent memory of the local control unit and alternatively thereto or in addition thereto can be transmitted to a remote central control, to inform an operator or power supply company regarding the removal of the metering unit. Moreover, based on the tamper signal, the local control unit or remote central control may switch off the subscriber line, as outlined before.

If in operation 705 it was determined that the reset counter did not exceed the reset limit, the flow returns to operation 702, where it is determined whether the electronic circuit is again set, i.e. whether the activation signal is again present at the electronic circuit. The activation signal will be present, if the metering unit has been removed from the metering base, e.g., if the switch 11 remains closed, as in this case the electronic circuit will again be activated. However, if the activation of the electronic circuit was in connection with a spurious event, such as electric magnetic discharges, radio frequency interferences and similar, the electronic circuit will not be again activated, thus remaining in a non-activated state. If the activation signal is not present in operation 702, the flow returns to operation 701.

If in operation 701 it was determined that a power-off condition occurred, and the power supply is now again available, in an operation 707 a real time clock is read. The real time clock is supplied by a battery, such as the battery 15 of FIG. 6, and measures the duration of a power outage at the local control unit.

In order to measure the time duration of the power outage, at the starting of the power off, a present RTC count could be frozen or memorized in a nonvolatile memory register. Provided that the RTC still continues with normal counting operations, e.g. by the battery backup, also during the power outage, a reading of the RTC value upon turning on the main power supply and a comparison with the previously memorized value provides a simple measurement of the outage duration.

Thereafter, in an operation 708 it is determined whether the duration of the power-off condition, i.e. the time read from the real time clock, exceeds a power-out limit. The power-out limit preferably is set to a time limit shorter than a time limit required for removing and manipulating the metering unit. For example, the power-off time limit could be set to one second, corresponding to the counter reset limit checked in operation 705. However, it is noted that any other power-off limit could be selected, such as five seconds, ten seconds and similar.

If it is determined in operation 708 that the power-off limit is exceeded, in an operation 709 it is determined whether the activation signal from the electronic circuit is present. The activation signal will be present, for example if during the power-out condition the metering unit was removed from the metering base and the electronic circuit was activated during the power-off condition.

If in operation 709 the activation signal is present, the flow continues with operation 706 for generating, storing and/or transmitting the tamper signal, etc., as noted before.

If in operation 709 the activation signal is not present, i.e., the electronic circuit was not activated during the power outage, the flow continues with operation 701.

Further, if in operation 708 the power-off duration did not exceed the power-off time limit, the flow of operations continues with operation 701$a$.

Accordingly, the operations outlined with regard to FIG. 7 allow an efficient determination of a removal of the metering unit from the metering base, while avoiding an erroneous detection of the removal of the metering unit due to spurious signals. Further, the operations outlined in FIG. 7 allow a determination of a removal of the metering unit also during a power-out condition.

According to an alternative, the real time clock read in operation 707, in an alternative to being started upon the begin of a power-out condition, could be initialized upon detecting an activation of the electronic circuit during a power-out condition.

Further, it is noted that some of the operations shown in FIG. 7 are optional, and may be omitted in alternative embodiments. For example, the operations in connection with determining a power-off condition, i.e. operations 701, 707, 708 and 709 may be omitted.

The advantages of the present invention can be briefly summarized as follows: The following conditions are activated after the alert situation has been discovered:

activation of an adequate anti-tampering alert flag according to the state of the meter, which flag can be "read" without delay by the local control unit or remote central control;

sending out a command to the remotely operable device for opening a power switch in order to interrupt (or suspend) the supply of energy to the customer;

inhibition of the manual closure of the power until a specific command is received from the remote central control or remote central server after confirmation of intervention by the control operator;

setting of a visual flag for supervisor personnel or providing an alert icon on the local display, the icon being also a signal for the registered subscriber of the control meter in the event that the actuation should be due to unknown third parties;

local visualizing, also physically, of the position taken up by the mandrel 6 expelled from the spring 7 and break of the lid 9.

It is at any rate understood that the invention is not limited to the specific disposition as explained above which only constitutes an example embodiment of the invention, but that various variants are possible, all of which lie within the abilities of a person skilled in the art, without exceeding the scope of protection of the invention as defined by the subsequent claims. It should particularly be borne in mind that in the illustrated embodiment, the electrical safety signal is activated on closing the interrupter 11 or 11a, but a modification of the mechanical system and of the electric circuit to the effect that the same result is achieved by means of a safety signal generated by opening the interrupter also lies within the capabilities of the skilled person in an obvious manner.

Further, while the above embodiments relate to the field of the distribution of electrical energy to a plurality of subscribers distributed within a territory, the invention is equally applicable in more general terms to other services such as, for example, the distribution of water, gas or to tele-heating. In this case metering components of the control meter will be appropriately replaced. For example, a valve for gas or water distribution may replace the power switch.

The invention claimed is:

1. A control meter for controlling the supply of services, in particular the supply of electric energy, the control meter comprising:
   a support base (1), anchored with which is a main power supply line; and a metering group (2) detachable from the support base (1) and comprising a measurement apparatus interposed between the main power supply line (20) and a subscriber line (50); and
   wherein the metering group (2) is mountable on the support base (1) by means of a bayonet-type attachment system, including a pair of hook-like members (2b, 2c) integral with one of the support base (1) and the bottom wall (2a) of the body (2) of the meter, and, two recessed members (1a, 1b) formed in the other one of the support base (1) and the bottom wall (2a) of the body (2) of the meter, facing the hook-like members, whereby the engagement of the hook-like teeth in the recessed members takes place due to a displacement of the body (2) of the control meter parallel to the support base;
   a safety anchorage comprising
      mechanical means (6, 7, 8, 9, 10) associated with the metering group (2) and movable into a locking position for engagement with the support base (1) when the metering group is mounted on the support base (1); and
      an interrupter (11, 11a, 11b) for generating an activation signal upon activation by the mechanical means;
   wherein the mechanical means (6, 7, 8, 9, 10) is arranged to form a locking bar against a parallel movement of the metering group relative to the support base and to activate the interrupter(11, 11a, 11b)when the mechanical means is released from the locking position for detaching the metering group from the support base.

2. The control meter of claim 1, wherein the mechanical means further comprise a retaining spanner (8) movable into retaining means (13) in the support base (1) in the locking position, to form a locking bar against displacement of the metering group (2) of the control meter relative to the support base (1).

3. The control meter of claim 2, wherein the mechanical means (6, 7, 8, 9, 10) comprises a locking bar mandrel (6) cooperating with the retaining spanner (8) and the interrupter (11, 11a, 11b) of the safety anchorage such that the blocking/unblocking movement of the locking bar mandrel (6) corresponds to the opening/closing movement of the interrupter.

4. The control meter of claim 3, wherein the locking bar mandrel (6) is arranged coaxially to the retaining spanner (8) which, when the mechanical means is in the locking position, is urged against a seat (12) of the support base to form a locking bar against a parallel movement of the metering group relative to the support base.

5. The control meter of claim 2, wherein the retaining means comprises seats (12, 13) and a threaded bushing for receiving a threaded portion of the retaining spanner (8) when the mechanical means is moved into the locking position.

6. The control meter of claim 3, wherein the mechanical means (6, 7, 8, 9, 10) comprises spring means (7) and/or a retainer part (15) acting on the locking bar mandrel (6) so as to move the locking bar mandrel in a direction away from the support base (1) when the retaining spanner (8) is released from the retaining means (12, 13).

7. The control meter of claim 3, wherein
   the interrupter (11, 11a, 11b) and the mechanical means (6, 7, 8, 9, 10) is located substantially inside a sealed container with part of the locking bar mandrel and the retaining spanner being accessible though an opening in the sealed container; and
   the locking bar mandrel comprises a lid (9) covering the retaining spanner (8), the retaining spanner being accessible for release from the locking position only by breaking the lid.

8. The control meter of claim 1, wherein the interrupter (11, 11a, 11b) is formed by a pair of flexible metal sheets (11a, 11b) resiliently contacting each other, and the mechanical means being provided with a wing (10) apt to interpose itself between the flexible metal sheets (11a, 11b) in the locking position.

9. The control meter of claim 1, wherein the interrupter of the safety anchorage is formed by a micro-interrupter (110, 111, 112), the command button (111) of which is actuated by an oscillating arm (112) moved by the mechanical means.

10. The control meter of claim 1, wherein the interrupter of the safety anchorage is formed by an optical transmitter and an optical receiver, forming a pair of optical devices with a transmitter-receiver coupling, and the mechanical means being provided with a wing apt to interrupt the transmitter-receiver coupling by interposing itself into the path between the optical transmitter and an optical receiver in the locking position.

11. The control meter of claim 1, in which one of the support base (1) and the metering group (2) comprises a series of resilient, fork-shaped supply terminals (23) and
   the other one of the support base (1) and the metering group (2) comprises an opposing series of mandrel-shaped control meter input terminals (51) for the subscriber line,
   whereby the anchoring movement of the bayonet-type attachment system also causes the mandrel-like terminals to be engaged in the opposing fork-shaped terminals.

12. The control meter of claim 1, wherein the interrupter is arranged to irreversibly command, upon actuation, the opening of a power switch (52) of the subscriber line (50).

13. The control meter of claim 1, comprising
   an electronic circuit (14) for memorizing the activation signal; and
   a local control unit for reading the activation signal from the electronic circuit and for sequentially resetting the electronic circuit (14) a predetermined number of times and for transmitting a tamper signal to an remote central control and/or interrupting the power supply and/or setting a local flag, if after the predetermined number of reset operations the electronic circuit holds the activation signal.

14. The control meter of claim 1, wherein the electronic circuit (14) is supplied by a battery (15) having the same service life as the meter.

15. The control meter of claim 13, wherein the local control unit is arranged to determine the occurrence of a power out condition and to transmit the tamper signal to the remote central control, if at the end of the power out condition the activation signal is present.

16. The control meter of claim 13, wherein the local control unit is arranged to transmit the tamper signal to the remote central control, if at the end of the power out condition the activation signal is present and if the duration of the power out condition exceeded a predetermined duration.

17. The control meter of claim 1, wherein the metering group includes a measurement apparatus comprising
- translating means for transforming the values of the effected measurements into data to be transmitted via communication lines, and
- communication means associated with the translating means to perform an exchange of measurement data and possible other processing data with a remote central control connected to the control meter by means of a communication line.

18. The control meter of claim 1, wherein the activation signal commands a remote central control, provided with software for effecting the initiation and interruption of the energy supply, to interrupt the power supply to the customer by opening the power switch (52).

* * * * *